United States Patent [19]

Nagasaka et al.

[11] Patent Number: 4,546,726
[45] Date of Patent: Oct. 15, 1985

[54] APPARATUS FOR REACTING A SEMICONDUCTOR WAFER WITH STEAM

[75] Inventors: Syuichi Nagasaka, Hiratsuka; Siyoukichi Kaneko, Yokohama, both of Japan

[73] Assignee: Tokyo Shibaura Denki Kabushiki Kaisha, Kawasaki, Japan

[21] Appl. No.: 545,496

[22] Filed: Oct. 26, 1983

[30] Foreign Application Priority Data

Nov. 4, 1982 [JP] Japan .................. 57-192487

[51] Int. Cl.⁴ ............................................. C23C 13/08
[52] U.S. Cl. ..................................... 118/719; 118/725; 118/726; 427/93
[58] Field of Search ............... 432/198; 34/231; 118/715, 724, 725, 726, 50, 50.1, 900, 719; 427/255.4, 93, 95, 377

[56] References Cited

U.S. PATENT DOCUMENTS

| | | | |
|---|---|---|---|
| 3,441,000 | 4/1969 | Burd et al. | 118/719 |
| 3,517,643 | 6/1970 | Goldstein et al. | 118/715 |
| 3,661,117 | 5/1972 | Cornelius et al. | 118/724 |
| 4,018,184 | 4/1977 | Nagasawa et al. | 118/725 X |
| 4,167,915 | 9/1979 | Toole et al. | 118/724 X |
| 4,232,063 | 11/1980 | Rosler et al. | 118/725 X |
| 4,253,417 | 3/1981 | Valentijn | 118/724 X |
| 4,293,590 | 10/1981 | Takagi et al. | 427/93 |
| 4,315,479 | 2/1982 | Toole et al. | 118/719 X |

Primary Examiner—Norman Morgenstern
Assistant Examiner—Bernard F. Plantz
Attorney, Agent, or Firm—Finnegan, Henderson, Farabow, Garrett & Dunner

[57] ABSTRACT

An apparatus for reacting a semiconductor wafer with steam includes a reaction tube and a heater for heating the reaction tube. The reaction tube is divided into three chambers by partition plates having a through hole. Pure water is directly supplied into the most upstream chamber and is evaporated into steam. The steam enters the second chamber and further heated therein into superheated steam. The superheated steam enters the most downstream chamber in which a semiconductor wafer or wafers are placed, and is heated sufficient for reaction with the wafer to form an oxide film thereon.

8 Claims, 3 Drawing Figures

APPARATUS FOR REACTING A SEMICONDUCTOR WAFER WITH STEAM

BACKGROUND OF THE INVENTION

1. Field of the Invention

The present invention relates to an apparatus for reacting a semiconductor wafer surface with steam and, more particularly, to a steam oxidation apparatus for oxidizing a semiconductor wafer.

2. Description of the Prior Art

A semiconductor wafer (e.g., silicon wafer) is often oxidized by steam to form a thin oxide film (i.e., silicon dioxide) of the semiconductor. A conventional steam oxidation apparatus is shown in FIG. 1. The apparatus has a transparent quartz reaction tube 4 disposed horizontally in an electric furnace 1 and a flask 7 connected to one end 4a of the reaction tube 4 through a connecting pipe 6. Distilled water 10 is stored in the flask 7. A heater 2 of the electric furnace 1 is disposed around the reaction tube 4. A soaking tube 3 for keeping a temperature of the reaction tube 4 constant by heat dissipated from the heater 2 is disposed between the reaction tube 4 and the heater 2 so as to surround the reaction tube 4. The other end 4b of the reaction tube 4 constitutes a free end, which is capped with a quartz cap having a narrow opening. A plurality of semiconductor wafer 12 is placed on a silicon boat 11 at the intermediate portion of the reaction tube 4. A buffer plate 5 having a plurality of through holes for regulating steam flow from the flask 7 and bringing the steam flow into uniform contact with the wafers 12 is disposed inside the reaction tube 4 in the vicinity of the end 4a thereof. The distilled water 10 in the flask 7 is heated by a heater 9. A capillary tube 8 is inserted in the flask 7 to prevent bumping of the distilled water 10.

Steam from the distilled water 10 heated by the heater 9 flows into the reaction tube 4 through the connecting pipe 6 and is further heated by the heater 2. The heated steam passes through the buffer plate 5 and is brought into contact with the preheated wafers 12, so that the wafers 12 are oxidized. Thereafter, the steam flows out from the free end 4b of the reaction tube 4.

In the steam oxidation apparatus of the type described above, a relatively large amount of distilled water 10 stored in the flask 7 must be boiled to generate the steam required to oxidize the wafers. Thus, it takes a long period to time to start wafer oxidation. In addition to this disadvantage, the capacity of the flask 7 is limited, so that prolonged oxidation must be occasionally interrupted and distilled water must be replenished in the flask 7. During this replenishment, the internal atmosphere of the reaction tube 4 must not be disturbed, resulting in cumbersome, time-consuming operation. Furthermore, when distilled water remains in the flask 7 after one oxidation cycle and is left therein, bacteria are able to propagate therein. In this case, such bacteria adversely affect the internal atmosphere of the reaction tube 4. As a result, the internal atmosphere of the reaction tube 4 cannot be stabilized to be uniform, and the oxide film formed on the wafer is impaired.

SUMMARY OF THE INVENTION

It is, therefore, an object of the present invention to provide an apparatus for reacting a wafer surface with steam, wherein a reaction can be immediately started without wasting time in boiling distilled water, and a continuous prolonged reaction between the wafer surface and the steam can be performed.

The reaction apparatus of the present invention includes a reaction tube having a free end and a coupling end. A pipe is connected to the coupling end of the reaction tube so as to communicate with the interior of the reaction tube. Pure water is directly supplied through this pipe to the reaction tube. A heating means is disposed around the reaction tube so as to heat the reaction tube.

First, second and third chambers are defined in the reaction tube from the side of the coupling end. The first chamber is defined as being between the coupling end of the reaction tube and a first partition plate disposed inside the reaction tube and is located at the upstream end of the reaction tube with respect to the steam flow. A through hole is formed in the first partition plate.

The second chamber is defined as being between the first partition plate and a second partition plate disposed downstream of the first partition plate. A through hole is formed in the second partition plate.

The third chamber is defined by the second partition plate and is disposed downstream of the second chamber. The third chamber allows semiconductor wafers to be placed therein.

Pure water is supplied to the first chamber through the pipe and is evaporated inside the first chamber by heat from the heating means, thereby generating steam. This steam flows into the second chamber through the through hole in the first partition plate and is further heated by heat from the heating means, thereby generating superheated steam. This superheated steam flows into the third chamber through the through hole in the second partition plate and is further heated to a temperature required for reaction with the wafer. The steam is then brought into contact with the wafer surface and reacts therewith (causing oxidation). Thereafter, the steam flows out for the free end of the reaction tube.

The second partition plate may have a plurality of through holes for regulating the steam flow and bringing the steam into uniform contact with the wafer surface.

In addition to this modification, one or more additional partition plates may be provided to divide the first chamber into two or more subchambers. In this case, the additional partition plates must have through holes, respectively.

DETAILED DESCRIPTION OF THE PREFERRED EMBODIMENTS

The present invention will be described in detail with reference to the accompanying drawings.

Figure 2:
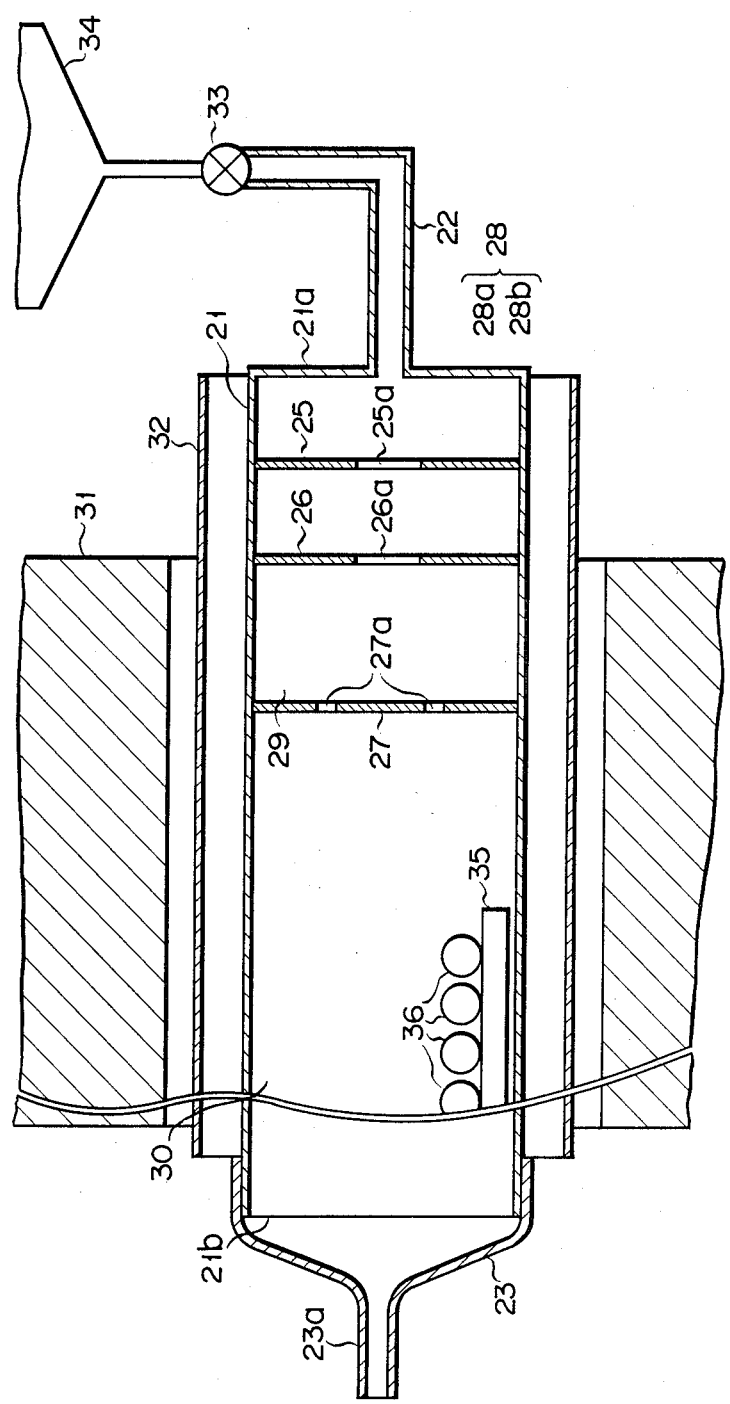
FIG. 2 is a sectional view of a reaction apparatus according to an embodiment of the present invention.

An apparatus shown in FIG. 2 has a reaction tube 21 having a coupling end 21a and a free end 21b. The reaction tube 21 is made of a material such as quartz which does not interfere with a reaction between steam and a semiconductor wafer surface. The reaction tube 21 is disposed to be substantially horizontal.

A pipe 22 which communicates with the inside of the reaction tube 21 is coupled to the coupling end 21a of the reaction tube 21. The pipe 22 communicates through a valve 33 with a tank 34 for storing pure water.

A cap 23 (made of, e.g., quartz) which is tapered toward an end 23a thereof is hermetically mounted on the free end 21b of the reaction tube 21.

The interior of the reaction tube 21 is divided by partition plates 26 and 27 which are made of the same material as the reaction tube 21. A first chamber 28 is defined between the coupling end 21a of the reaction tube 21 and the partition plate 26. In the embodiment shown in FIG. 2, the chamber 28 is itself divided by a partition plate 25 into subchambers 28a and 28b.

A second chamber 29 is defined between the partition plates 26 and 27.

A third chamber 30 is larger than either the chamber 28 or 29. A plurality of semiconductor wafers 36 are placed on a wafer boat 35 in the third chamber 30.

Figure 1:
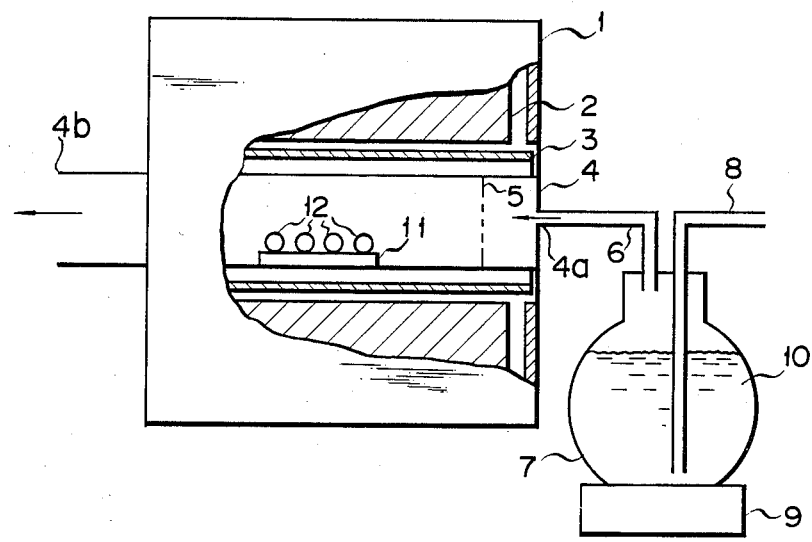
FIG. 1 is a partially cutaway view schematically showing a conventional steam oxidation apparatus.

Relatively large through holes 25a and 26a are formed at centers of the partition plates 25 and 26, respectively, to pass steam therethrough. The partition plate 27 has a plurality of through holes 27a for controlling the flow of steam such that the steam is brought into uniform contact with the wafers in the chamber 30. The partition plate 27 corresponds to the buffer plate 5 of the apparatus shown in FIG. 1.

A heater 31 of an electric furnace is disposed around the reaction tube 21. A soaking tube 32 (made of, e.g., silicon carbide) is provided between the heater 31 and the reaction tube 21 to uniformly heat at least the interior of the chamber 30 of the reaction tube 21 by heat from the heater 31. In the apparatus shown in FIG. 2, the chamber 28 lies outside the region of the heater 31 but falls within the region of the soaking tube 32.

The flow rate of pure water is controlled by the valve 33, such that distilled water in a controlled amount is directly supplied from the tank 34 to the subchamber 28a through the pipe 22. The delivered pure water is immediately evaporated in the subchamber 28a, which is sufficiently heated for this purpose by the heater 31 through the soaking plate 32, thereby obtaining steam. This steam flows into the subchamber 28b through the through hole 25a in the partition plate 25, and a fraction thereof may be condensed and then evaporated again. This re-evaporated fraction, together with the noncondensed fraction, flows into the chamber 29 through the through hole 26a in the partition plate 26. The subchamber 28b is located closer to the heater 31 than is the subchamber 28a. Steam in the subchamber 28b is therefore heated to a temperature higher than that in the subchamber 28a.

The steam flowing in the chamber 29 is further heated and becomes superheated steam. This superheated steam flows into the chamber 30 through the through holes 27a in the partition plate 27. The steam flowing in the chamber 30 is heated to a temperature required for reaction with the surfaces of wafers 36. The steam is brought into contact with the surface of the wafer 36 and reacts therewith. Thin oxide layers are formed on the surfaces of the wafers 36, respectively. Thereafter, the steam flows out from the free end 21b of the reaction tube 21 and is discharged to the outside through the cap 23.

The portion of the reaction tube 21 which constitutes the chamber 28 must be heated to a sufficient temperature at which the pure water supplied therein is heated sufficiently to form steam. However, the temperature of this portion must not be so high as to damage the reaction tube 21 itself due to a temperature difference between the chamber 28 and the pure water. The temperature of this portion of the chamber 28 must generally fall within the range of more than 100° C. up to 500° C.

The chamber 30 is kept at a sufficient temperature to cause the steam to react with the wafers 36. When the wafers 36 comprise silicon, a reaction temperature preferably falls within the range between about 1,000° C. and 1,100° C., and is most preferably set at a temperature of about 1,050° C.

The second or intermediate chamber 29 serves to further increase the temperature of the steam therein before the steam flows into the chamber 30. The steam therein is preferably heated to a temperature corresponding to at least 80% of the temperature inside the chamber 30. In general, the preferable temperature is 800° C. or higher, but is lower than the temperature inside the chamber 30.

The steam is heated in a stepwise manner through the chambers, so that the oxidation temperature in the chamber 30 can be readily controlled to fall within an allowable range of ±5° C.

The flow rate of the pure water supplied from the pipe 22 to the chamber 28 is set to be sufficiently low so that substantially all the water in the chamber 28 is evaporated. The distilled water supplied to the chamber 28 must not flow as water into the chamber 29 through the through hole 26a in the partition plate 26. The flow rate can be easily determined in accordance with the temperature inside the chamber 28 and the evaporated amount of the pure water.

The temperature conditions of the chambers 28, 29 and 30 can be easily satisfied in accordance with the relative positions of the reaction tube 21, the heater 31 and/or the soaking tube 32. For example, a reaction tube disposed in an electric furnace used for silicon wafer oxidation by steam generally has identifiable areas which satisfy the required graded temperature conditions from the coupling end to the center thereof. The positions of the partitions 26 and 27 can be determined to define the chamber 28, 29 and 30 so that they correspond to these area, respectively. For example, when the apparatus shown in FIG. 2 is used for oxidation of a silicon wafer surface, the inner diameter of the reaction tube 21 may fall within the range between 90 mm and 150 mm; the overall length of the reaction tube 21 may fall within the range between 2,200 mm and 2,600 mm; the distance between the coupling end 21a of the reaction tube 21 and the partition plate 26 may fall within the range between 200 mm and 300 mm; and the distance between the coupling end 21a to the partition plate 27 may fall within the range between 400 mm and 600 mm. The inner diameter of the pipe 22 may fall within the range between 5.0 mm and 15 mm. Under these conditions, the flow rate of the distilled water is preferably 1 to 10 ml/min.

When the chamber 28 is divided into a plurality of subchambers as in the embodiment described above, all of the pure water in the entire chamber 28 can be more effectively evaporated.

Figure 3:
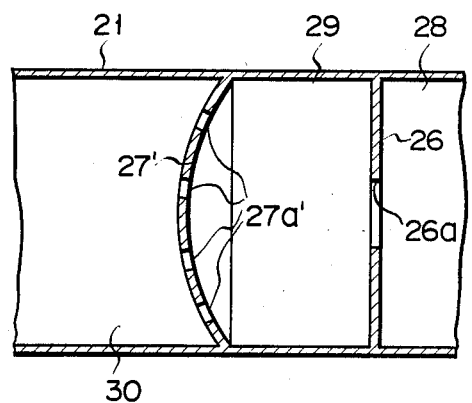
FIG. 3 is a sectional view partially showing a reaction tube used in a reaction apparatus according to another embodiment of the present invention.

A reaction tube 21, part of which is shown in FIG. 3, is substantially the same as that shown in FIG. 2, except that the shape of a partition plate 27' for separating the chambers 29 and 30 differs from that of the partition plate 27. The partition plate 27' is arcuated and has a plurality of through holes 27'a parallel to each other along the radial direction of the arcuated partition plate. Thus, the steam in the chamber 29 passes through the through holes 27'a and collides with the inner wall of the chamber 30 at various angles, so that a turbulent flow occurs. As a result, the stream flow is brought into uniform contact with the wafers, thereby causing more uniform oxide films to be formed on the respective wafer surfaces.

According to the present invention as described above, the reaction tube is divided into three chambers wherein distilled water is fed into the chamber at the most upstream of the steam flow and is evaporated to generate steam by utilizing heat from the heater of the electric furnace. Therefore, unlike the conventional apparatus wherein the pure water is boiled in advance in a flask disposed outside the reaction tube, the time required for boiling the pure water can be omitted, so that a desired reaction can be immediately initiated once the required temperature conditions of the reaction tube are established. Unlike the conventional apparatus wherein the pure water is stored in a container and is boiled, the water supply is not limited, so that the oxidation reaction can be continuously performed over a long period of time without impairing the atmosphere inside the reaction tube. In addition to this advantage, the pure water supplied to the reaction tube is immediately evaporated, so that no residual water is left in the reaction tube, thus eliminating the problem of the propagation of bacteria.

What is claimed is:

1. An apparatus for reacting a semiconductor wafer with steam, comprising:
    a reaction tube for placing the semiconductor wafer therein, said reaction tube having a free end and a coupling end and being disposed to be substantially horizontal;
    a pipe, coupled to said coupling end of said reaction tube, for communicating with an interior said reaction tube;
    pure water supply means coupled to said pipe for supplying water to said reaction chamber;
    heating means for heating said reaction tube;
    a first chamber defined by a first partition plate in said reaction tube, said first partition plate being disposed in said reaction tube to be spaced apart from said coupling end of said reaction tube and having a through hole, said first chamber being supplied with the pure water through said pipe, and the pure water being evaporated to generate steam by heat from said heating means;
    a second chamber defined between said first partition plate and a second partition plate in said reaction tube, said second partition plate being disposed downstream of said first partition plate and having a through hole, the steam which is generated in said first chamber being supplied to said second chamber through said through hole in said first partition plate, and the steam in said second chamber being heated by the heat from said heating means, thereby generating superheated steam; and
    a third chamber defined by said second partition plate and downstream of said second chamber in said reaction tube, and third chamber being arranged such that the semiconductor wafer may be placed therein, the superheated steam being supplied from said second chamber to said third chamber through said through hole in said second partition plate, the superheated steam being further heated in said third chamber to a sufficient temperature for a reaction with the semiconductor wafer to occur, and the superheated steam being brought into contact with a surface of the semiconductor wafer and reacted steam flowing out from said free end of said reaction tube.

2. An apparatus according to claim 1, wherein said heating means comprises an electric furnace heater for heating said reaction tube such that a first area of said reaction tube is heated at a temperature falling within a range between 100° C. and 500° C., a second area thereof is heated at a temperature falling within a range between 800° C. and a reaction temperature, and a third area thereof is heated at a temperature falling within a range between 1,000° C. and 1,100° C., said first, second and third areas corresponding to said first, second and third chamber, respectively.

3. An apparatus according to claim 1, wherein said second partition plate has a plurality of through holes for bringing the superheated steam into uniform contact with the semiconductor wafer in said third chamber.

4. An apparatus according to claim 3, wherein said second partition plate is arcuated and each of said plurality of through holes in said second partition plate extends along radial direction of said second partition plate.

5. An apparatus according to claim 1, wherein said first chamber is divided into at least two subchambers by at least one additional partition plate having a through hole.

6. An apparatus according to claim 1, further including means for supplying the pure water to said first chamber through said pipe at a predetermined flow rate.

7. An apparatus according to claim 1, wherein a cap having a tube-like distal end is mounted on said free end of said reaction tube.

8. An apparatus according to claim 1, further including a soaking tube disposed between said heating means and said reaction tube so as to uniformly heat at least said third chamber by the heat from said heating means.

* * * * *